(12) United States Patent
Jiao et al.

(10) Patent No.: US 9,568,764 B2
(45) Date of Patent: Feb. 14, 2017

(54) DISPLAY SUBSTRATE, DISPLAY PANEL AND DISPLAY DEVICE

(71) Applicant: BOE TECHNOLOGY GROUP CO., LTD., Beijing (CN)

(72) Inventors: Zhiqiang Jiao, Beijing (CN); Li Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 55 days.

(21) Appl. No.: 14/646,131

(22) PCT Filed: Sep. 5, 2014

(86) PCT No.: PCT/CN2014/086076
§ 371 (c)(1),
(2) Date: May 20, 2015

(87) PCT Pub. No.: WO2015/188474
PCT Pub. Date: Dec. 17, 2015

(65) Prior Publication Data
US 2016/0266436 A1 Sep. 15, 2016

(30) Foreign Application Priority Data

Jun. 12, 2014 (CN) .......................... 2014 1 0262118

(51) Int. Cl.
*G02F 1/1335* (2006.01)
*H01L 51/52* (2006.01)
*H01L 27/32* (2006.01)

(52) U.S. Cl.
CPC ....... *G02F 1/133514* (2013.01); *G02F 1/1335* (2013.01); *G02F 1/133512* (2013.01);
(Continued)

(58) Field of Classification Search
None
See application file for complete search history.

(56) References Cited

U.S. PATENT DOCUMENTS 7,969,085 B2 6/2011 Cok
2009/0257006 A1* 10/2009 Ko .......................... G02B 5/22
349/106

(Continued)

FOREIGN PATENT DOCUMENTS

CN 1336566 A 2/2002
CN 1441629 A 9/2003
(Continued)

OTHER PUBLICATIONS

International Search Report mailed Nov. 3, 2015; PCT/CN2014/086076.
(Continued)

*Primary Examiner* — Phu Vu
(74) *Attorney, Agent, or Firm* — Ladas & Parry LLP

(57) ABSTRACT

A display substrate, a display panel and a display device are disclosed. The display substrate includes: a base substrate (1), and a color film structure (2) and a transparent conductive oxide film layer (3) subsequently laminated on the base substrate (1). The color film structure (2) includes a plurality of color filter units arranged in a matrix and having different colors; at least one color of the color filter units in the color film structure (2) includes at least two layers of laminated color filter films, refractive indices of the color filter films gradually increase in a direction from the base substrate (1) towards the transparent conductive oxide film layer (3), and one layer of the color filter films adjacent to the base substrate (1) has refractive index larger than that of the base substrate (1), one layer of the color filter films adjacent to the transparent conductive oxide film layer (3) has refractive index less than that of the transparent conductive oxide film layer (3). The display substrate reduces the loss of light transmitted in the display panel, and thus the display brightness of the display device is increased.

16 Claims, 4 Drawing Sheets

(52) U.S. Cl.
CPC ............ *H01L 27/32* (2013.01); *H01L 27/322* (2013.01); *H01L 51/52* (2013.01); *H01L 51/524* (2013.01); *H01L 51/5215* (2013.01); *H01L 51/5234* (2013.01); *H01L 51/5275* (2013.01); *G02F 2202/16* (2013.01)

(56) References Cited

U.S. PATENT DOCUMENTS

2012/0119239 A1   5/2012  Kim et al.
2013/0128193 A1*  5/2013  Yang ................ G02F 1/133502
                                                                                             349/106

FOREIGN PATENT DOCUMENTS

| CN | 101515084 A | 8/2009 |
|---|---|---|
| CN | 101807633 A | 8/2010 |
| CN | 102879948 A | 1/2013 |
| CN | 103235356 A | 8/2013 |
| CN | 203882058 U | 10/2014 |

OTHER PUBLICATIONS

Written Opinion of the International Searching Authority mailed Mar. 11, 2015; PCT/CN2014/086076.

* cited by examiner

DISPLAY SUBSTRATE, DISPLAY PANEL AND DISPLAY DEVICE

TECHNICAL FIELD

Embodiments of the present invention relates to a display substrate, a display panel and a display device.

BACKGROUND

In the current Organic Light Emitting Diodes (OLED) and Liquid Crystal Displays (LCD), there is a usual problem of lower brightness. This problem is caused by that the anodes in the OLEDs and the pixel electrodes and common electrodes in the LCDs are generally made of Indium Tin Oxides (ITO) with the refractive index of 1.8, there is a relative large refractive index difference between the ITO film and a glass substrate with the refractive index of 1.5. When incident light is irradiated to the glass substrate after passing the ITO film, part of the incident light will be subjected to total reflection, thus the light emitted from the glass substrate will be subjected to loss problem, thereby directly affecting the display brightness of OLEDs and LCDs.

SUMMARY

According to one aspect of the present invention, a display substrate comprising a base substrate, and a color film structure and a transparent conductive oxide film layer subsequently laminated on the base substrate, wherein the color film structure comprises a plurality of color filter units arranged in a matrix and having different color. The at least one color of the color filter units in the color film structure comprises at least two layers of laminated color filter films, refractive indices of the color filter films gradually increases in a direction from the base substrate towards the transparent conductive oxide film layer, and one layer of the color filter films adjacent to the base substrate has a refractive index larger than that of the base substrate, one layer of the color filter films adjacent to the transparent conductive oxide film layer has a refractive index less than that of the transparent conductive oxide film layer.

In one example, each layer of the color filter films has a thickness less than or equal to 0.45 µm.

In one example, each layer of the color filter films has a thickness less than a minimum wavelength of the visible light.

In one example, the color film structure comprises a blue color filter unit comprising at least two layers of laminated color filter films.

In one example, the blue color filter unit comprises four layers of laminated the color filter films.

In one example, in the color film structure, the color filter units in all the colors each comprises at least two layers of laminated color filter films.

In one example, in the color film structure, the color filter units in all colors each comprises four layers of laminated color filter films.

In one example, the color film structure further comprises a red color filter unit and a green color filter unit which have a single-layer structure.

In one example, the display substrate further comprises a flat layer disposed between the color film structure and the transparent conductive oxide film layer.

In one example, the display substrate further comprises a black matrix disposed between the adjacent color filter units.

According to the second aspect of the present invention, a display panel comprising the above display substrate is provided.

In one example, the display panel is a liquid crystal display panel or an organic light emitting diode display panel.

In one example, the display panel is the liquid crystal display panel which comprises the display substrate functioning as a color film substrate, an array substrate and a layer of liquid crystal sandwiched between the color film substrate and the array substrate.

In one example, the display panel is the organic light emitting diode display panel, wherein the transparent conductive oxide film layer function as an anode, the organic light emitting diode display panel further comprises a light emitting layer, a cathode, a pixel defining layer and an encapsulation layer.

According to the third aspect of the present invention, a display device comprising the above display panel is provided.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

The shape and thickness of each of the film layers in drawings are not intended to show the real scale, but to schematically describe the content of the present invention.

Figure 1A:
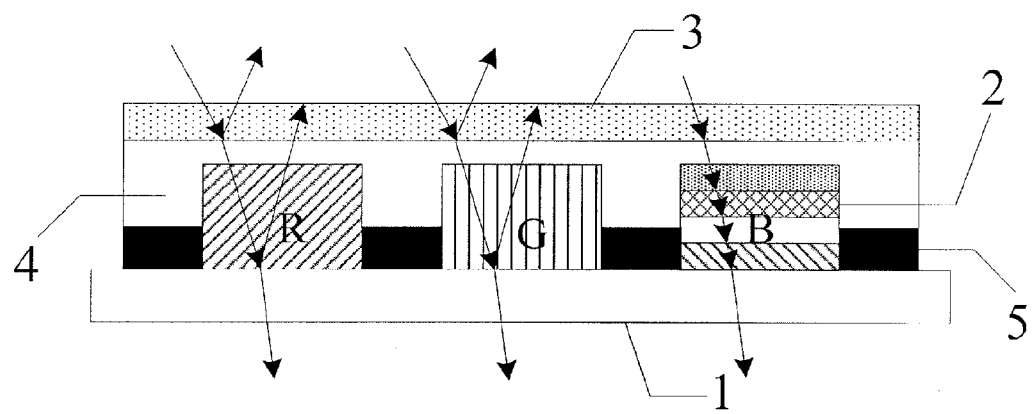
FIG. 1a and FIG. 1b are schematic diagrams illustrating a configuration of display substrate provided by embodiments of the present invention, respectively.
Figure 1B:
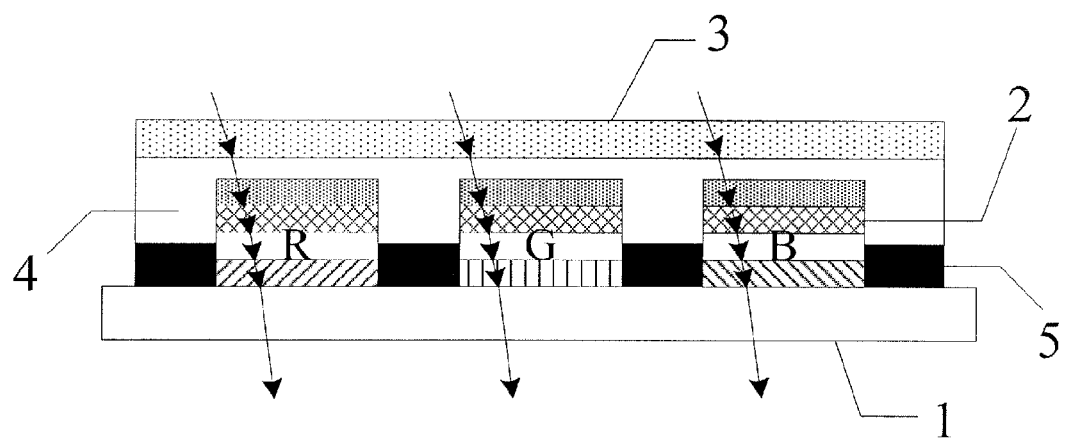

Embodiments of the present invention provide a display substrate, as shown in FIG. 1a and FIG. 1b, the display substrate comprises a base substrate 1, and a color film structure 2 and a transparent conductive oxide film layer 3 subsequently laminated on the base substrate 1. The color film structure 2 comprises a plurality of color filter units arranged in a matrix and having different colors (for example, red (R) color filter unit, green (G) color filter unit and blue (B) color filter unit, respectively, as shown in FIG. 1a and FIG. 1b).

In the color film structure 2, at least one color of the color filter units comprises at least two layers of laminated color filter films.

In the color filter unit comprising at least two layers of color filter films, the refractive index of each of the color filter films is gradually increased from the base substrate 1 towards the transparent conductive oxide film layer 3, and one layer of the color filter films adjacent to the base substrate 1 has refractive index larger than that of the base substrate 1, and one layer of the color filter films adjacent to the transparent conductive film layer 3 has refractive index less than that of the transparent conductive oxide film layer 3.

As the arrow directions shown in FIG. 1a and FIG. 1b, in the above display substrate provided by the embodiments of the present invention, when light is incident into the transparent conductive oxide film layer 3 and emitted from the base substrate 1 after passing through the color film structure 2, the total reflection caused by the large refractive index difference between the transparent conductive oxide film layer 3 and the base substrate 1 can be reduced, thus the loss of light during its propagation in the display panel can be reduced, and therefore, the display brightness of the display device can be increased.

In one example, the transparent conductive oxide film layer 3 can be made of Indium Tin Oxide (ITO), Indium Zinc Oxide (IZO), Indium Gallium Zinc Oxide (IGZO), or the like, and there is no limitation thereon. The refractive index of the ITO is 1.92, the refractive index of the IZO and IGZO is 2.05, and the base substrate 1 is typically a glass substrate with the refractive index of 1.5. Therefore, the layer of the color filter film adjacent to the base substrate 1 has refractive index larger than that of the glass substrate, e.g. larger than 1.5, and the layer of the color filter film adjacent to the transparent conductive film layer 3 has refractive index less than that of the transparent conductive film layer 3, e.g. less than 1.9.

In one example, in the color filter unit comprising at least two layers of color filter films, the more the layer of the color filter film is, the less the refractive index difference between two adjacent color filter films is, whereby, the better the total reflection effect of the light in the layers of the color filter films is. Of course, it is necessary to meet the requirement that the refractive index of each layers of the color filter films is gradually increased in a direction from the base substrate 1 towards the transparent conductive oxide film layer 3, and one layer of the color filter films adjacent to the base substrate 1 has refractive index larger than that of the base substrate 1, and one layer of the color filter films adjacent to the transparent conductive oxide film layer 3 has refractive index less than that of the transparent conductive oxide film layer 3, therefore, the practical number of the layers of the color filter films depends on the existing materials for fabricating the color filter films.

As shown in FIG. 1a and FIG. 1b, the transparent conductive oxide film layer 3 can be provided as a layer entirely overlaying the substrate; alternatively, according to the function of the transparent conductive oxide film layer 3 in the display substrate, the transparent conductive oxide film layer 3 may have a pattern formed by patterning process, there is no limitation here.

In FIG. 1a and FIG. 1b, the color film structure 2 is described as comprising the color filter units in tri-colors of red (R), green (G), and blue (B); alternatively, in order to increase the display brightness of the display device, the color film structure 2 may also comprise the color filter units in four colors, i.e. red (R), green (G), blue (B), and white (W); alternatively, in order to increase the gamut of the picture displayed by the display device, the color film structure 2 may also comprise the color filter units in four colors, i.e. red (R), green (G), blue (B), and yellow (Y); alternatively, the color film structure 2 may also comprise the color filter units in other colors, there is no limitation herein.

In the above display substrate provided by the embodiment of the present invention, at least one color of the color filter units in the color film structure 2 comprises at least two layers of laminated color filter films. For example, the color filter unit in one color (such as, any one color from red (R), green (G), blue (B), white (W) and yellow (Y)) in the color film structure 2 comprises at least two layers of laminated color filter films. As shown in FIG. 1a, only the color filter unit in blue color in the color film structure 2 is composed of four layers of laminated color filter films; alternatively, in the color film structure 2, the color filter units in any two colors (such as, any two colors from red (R), green (G), blue (B), white (W) and yellow (Y)) each comprises at least two layers of laminated color filter films; Alternatively, the color filter units in all colors each comprises at least two layers of laminated color filter films. As shown in FIG. 1b, each of the red (R), green (G), and blue (B) color filter units in the color film structure 2 is composed of four layers of laminated color filter films, and there is no limitation thereon.

Compared with the red (R) color filter unit and the green (G) color filter unit, the emission efficiency of the blue (B) color filter unit is relative low, and therefore, in order to enable the entire displayed picture to render good white balance, in the above display substrate provided by the embodiment of the present invention, only the blue (B) color filter unit in the color film structure 2 comprises at least two layers of laminated color filter films, and the color filter units in other colors (such as, red (R), green (G), white (W), yellow (Y), and so on) are provided as a single-layer structure. As shown in FIG. 1a, in the color film structure 2, the color filter unit in blue (B) color is composed of four layers of laminated color filter films, and the color filter units in red (R) and green (G) colors are both of single-layer structure.

When manufacturing the display substrate as shown in FIG. 1a, for example, red (R) resin material with refractive index of 1.65 is spin coated on the base substrate 1, after exposure, development and curing process, to form the red (R) color filter unit having a layer of red (R) color filter film; green (G) resin material with refractive index of 1.68 is spin coated on the base substrate 1, and after exposure, development and curing process, to form the green (G) color filter unit having a layer of green (G) color filter film; and blue resin materials with refractive index of 1.57, 1.62, 1.67 and 1.72 are respectively spin coated on the base substrate 1, after exposure, development and curing process, to form the blue (B) color filter unit having four layers of blue (B) color filter films.

In order to increase the display brightness of the whole display picture, in the above display substrate provided by the embodiment of the present invention, the color filter units in all colors in the color film structure 2 all comprise at least two layers of laminated color filter films. As shown in FIG. 1b, in the color film structure 2, the color filter units in red (R), green (G) and blue (B) colors are all composed of four layers of laminated color filter films.

When manufacturing the display substrate shown in FIG. 1b, for example, red (R) resin materials having refractive index of 1.55, 1.6, 1.65 and 1.75 are respectively spin coated on the base substrate, after exposure, development and curing process, to form the red (R) color filter unit having four layers of red (R) color filter films; green (G) resin materials having refractive index of 1.55, 1.59, 1.71 and 1.75 are respectively spin coated on the base substrate 1, after exposure, development and curing process, to form the green (G) color filter unit comprising four layers of green (G) color filter films; and blue resin materials with refractive index of 1.52, 1.55, 1.58 and 1.74 are respectively spin coated on the base substrate 1, after exposure, development and curing process, to form the blue (B) color filter unit having four layers of blue (B) color filter films.

In order to further reduce the total reflection during light propagation in the display substrate, in one example, the thickness of each of the color filter films is less than or equal to 0.45 μm. Since the emitting wavelength for the three primary colors red (R), green (G) and blue (B) is ranged from 0.45 μm to 0.54 μm, when the thickness of each of the color filter films is less than or equal to 0.45 μm, it can be guaranteed that the thickness of each of the color filter films is less than the emitting wavelength of the three primary colors red (R), green (G) and blue (B); in this way, it is possible that the light in the three primary colors red (R), green (G) and blue (B) is propagated in each layer of the color filter films in electromagnetic wave manner, and the total reflection phenomenon in the geometric optics will not occur, and thus the loss of light transmitted in the display panel is reduced, and therefore, the display brightness of the display device can be further increased.

Furthermore, in one example, thickness of each layer of the color filter films is less than the minimum wavelength of visible light, for example, the thickness of each layer of the color filter films is less than 0.38 μm; in this way, it is possible that no total reflection phenomenon occurs in each layer of the color filter films for the light in whole visible waveband, thus it is possible to avoid the loss of light transmitted in the display panel, and therefore, the brightness of the display device can be significantly increased.

In the above display substrate provided by the embodiment of the present invention, according to the display requirement for the different color pixels, the thickness of one or more layers of the color filter films can be suitably adjusted; according to the optical micro-cavity effect, full width at half maximum (FWHM) of the light can be narrowed after passing through the color filter films, and thus the purity of the pixel color can be increased.

In order to guarantee the flatness of the transparent conductive oxide film layer 3, in one example, a flat layer 4 is disposed between the color film structure 2 and the transparent conductive oxide film layer 3; the flat layer 4 is typically formed by spin coating acrylic material and curing the same; the thickness of the flat layer 4 is for example about 4 μm. Furthermore, a black matrix 5 is disposed between the color filter units; the black matrix 5 is typically formed by spin coating resin material and subjecting to exposure, development and curing process; the thickness of the black matrix 5 is for example 1.5 μm. In one example, the thickness of the color filter units in the color film structure 2 is from 1.5 μm to 3 that is, the thickness of each color filter film in the color film structure 2 is larger than the thickness of the black matrix 5.

Based on the same inventive concept, the embodiments of the present invention further provide a display panel comprising the above display substrate provided by the embodiment of the present invention. The display panel can be implemented by referring to the above embodiments of the display substrate, and will not be further described in detail.

The display panel can be a liquid crystal display panel (LCD); alternatively, can be an organic light emitting diode display panel (OLED), there is no limitation herein.

Figure 2A:
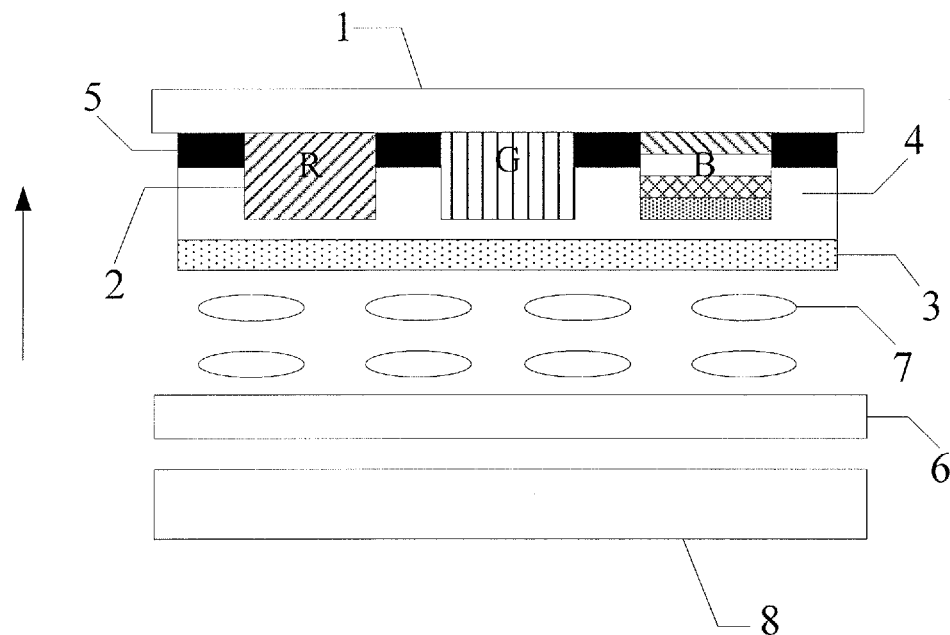
FIG. 2a to FIG. 2d are schematic diagrams illustrating a configuration of display panel provided by embodiments of the present invention when used as a liquid crystal display panel, respectively.
Figure 2B:
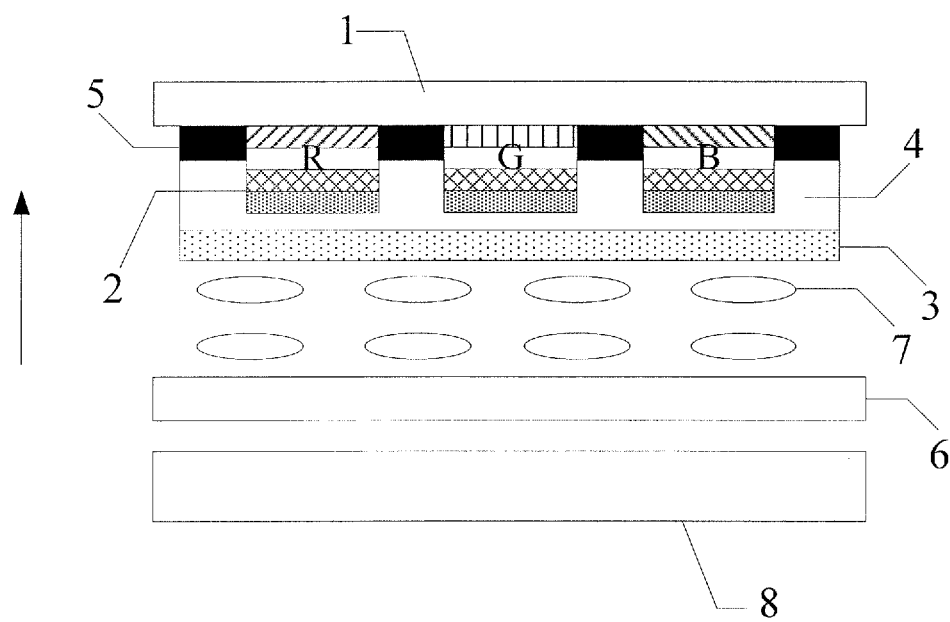

FIG. 2a and FIG. 2b are schematic diagrams illustrating the display substrates of FIG. 1a and FIG. 1b applied into a LCD where the transparent conductive oxide layer 3 is used as a common electrode. The base substrate 1 is used as a color film substrate of the LCD, and the transparent conductive oxide film layer 3 is used as a common electrode. The LCD further comprises: an array substrate 6 disposed opposite to the color film substrate, a liquid crystal layer 7 disposed between the color film substrate and the array substrate, and a backlight module 9 disposed at a side of the array substrate facing away from the color film substrate, and so on. As shown in FIG. 2a and FIG. 2b, the transparent conductive oxide film layer 3 functioning as the common electrode may be provided at a side of the color film substrate adjacent to the liquid crystal layer, which forms a Twisted Nematic (TN) type LCD. Alternatively, the transparent conductive oxide film layer 3 functioning as the common electrode may be provided at a side of the array substrate 6 adjacent to the liquid crystal layer, which forms an Advanced Super Dimension Switch (ADS) type LCD. There is no limitation herein.

After passing through the transparent conductive oxide film layer 3, i.e. the common electrode, and the color film structure 2 subsequently, the light emitted from the backlight module 8 exits the base substrate 1, i.e. color film substrate. Since at least one color of the color filter units in the color film structure 2 comprises at least two layers of laminated color filter films, and the refractive index of the color filter films is gradually increased in a direction from the base substrate, i.e. the color film substrate, towards the transparent conductive oxide film layer 3, i.e. the common electrode, and the layer of the color filter film adjacent to the base substrate 1, i.e. the color film substrate has a refractive index larger than the refractive index of the base substrate, i.e. the color film substrate, and the layer of the color filter film adjacent to the transparent conductive oxide film layer 3, i.e. the common electrode, has a refractive index less than the refractive index of the transparent conductive oxide film layer 3, i.e. the common electrode, thus, the total reflection phenomenon caused by the large refractive index difference between the transparent conductive oxide film layer 3, i.e. the common electrode and the base substrate 1, i.e. the color film substrate can be reduced, thus the loss of light transmitted in the LCD (in a direction as indicated by the arrow in FIG. 2a and FIG. 2b) can be reduced, and therefore, the display brightness of the LCD can be increased.

Figure 2C:
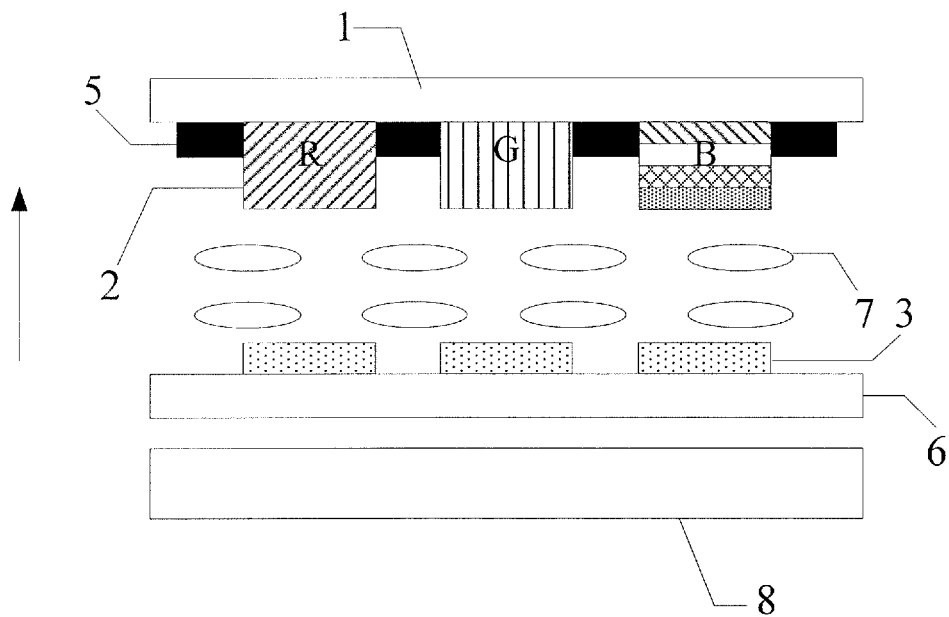
Figure 2D:
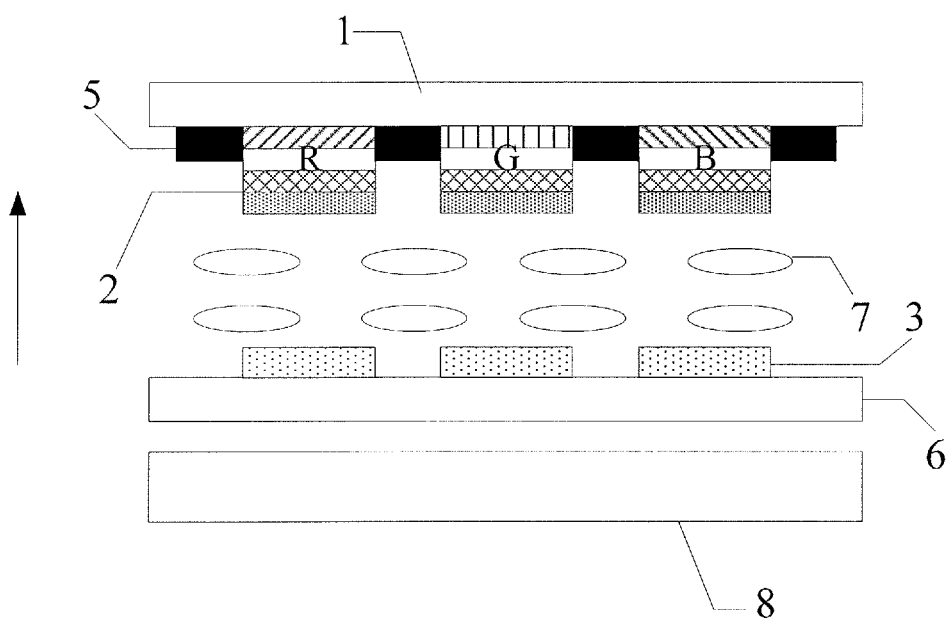

FIG. 2c and FIG. 2d are schematic diagrams illustrating the display substrates of FIG. 1a and FIG. 1b applied into a LCD where the transparent conductive oxide layer 3 is used as a pixel electrode. The transparent conductive oxide film layer 3 is located at a side of the array substrate 6 adjacent to the liquid crystal layer 7, the liquid crystal layer 7 is located between the transparent conductive oxide film layer 3 and the color film structure 2. Other film layers in FIG. 2c and FIG. 2d are same as that in FIG. 2a and FIG. 2b, and thus will not be described in detail.

In one example, the LCD further comprises a Thin Film Transistor (TFT), e.g. a low temperature polysilicon TFT, or an oxide TFT, or a monocrystalline silicon TFT, and will not be further described.

Figure 3A:
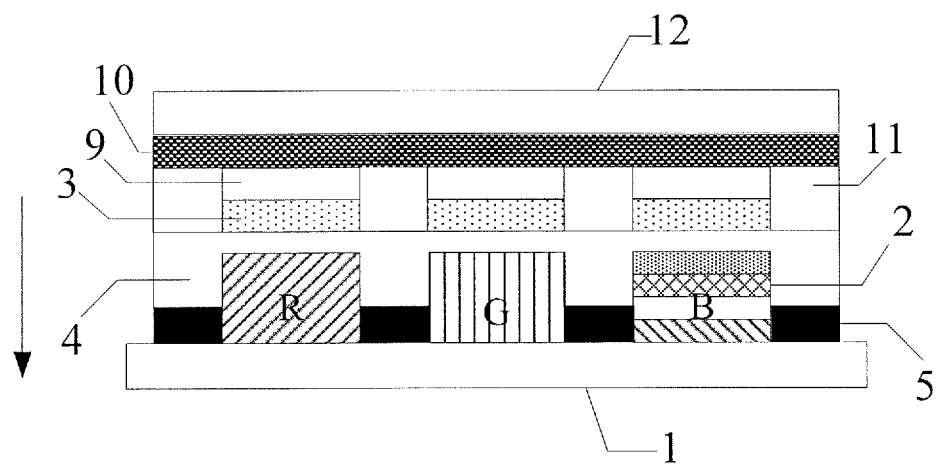
FIG. 3a and FIG. 3b are schematic diagrams illustrating a configuration of display panel provided by embodiments of the present invention when used as an organic light emitting diode display panel, respectively.
Figure 3B:
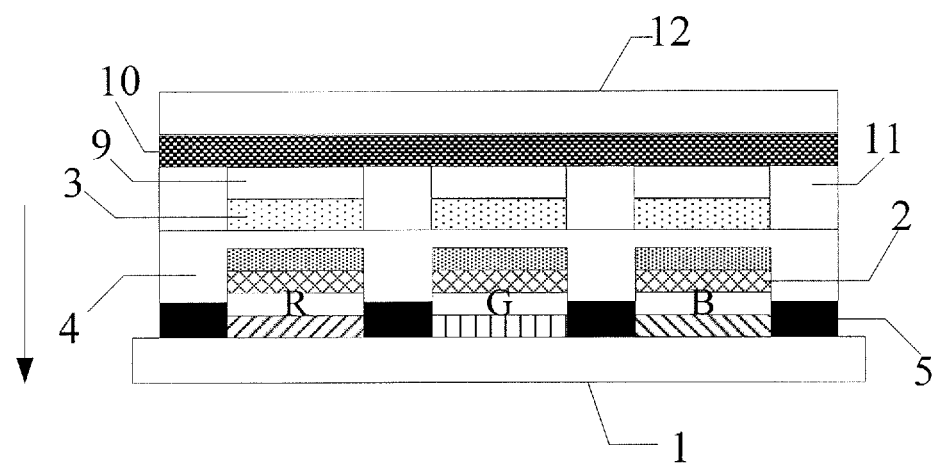

FIG. 3a and FIG. 3b are schematic diagrams when the display substrate shown in FIG. 1a and FIG. 1b is applied into an OLED. The base substrate 1 is used as a base substrate having a TFT, the transparent conductive oxide film layer 3 is used as an anode in the organic light emitting diode structure, the TFT is electrically connected with the transparent conductive oxide film layer 3, i.e. the anode, through vias in the flat layer 4. The OLED further comprises a light emitting layer 9 and a cathode 10 subsequently laminated on the transparent conductive oxide film layer 3, i.e. the anode, a pixel defining layer 11 disposed on the flat layer 4 and in an area corresponding to the black matrix 5, and an encapsulation layer 12 adhered to the cathode 10.

After passing through the transparent conductive oxide film layer 3, i.e. the anode, and the color film structure 2 subsequently, the light emitted from the light emitting layer 9 exits the base substrate 1. Since at least one color of the color filter units in the color film structure 2 comprises at least two layers of laminated color filter films, the refractive index of the color filter films is gradually increased in a direction from the base substrate 1 towards the transparent conductive oxide film layer 3, i.e. the anode, and the refractive index of the layer of the color filter film adjacent to the base substrate 1 is larger than the refractive index of the base substrate 1, and the refractive index of the layer of the color filter film adjacent to the transparent conductive oxide film layer 3, i.e. the anode is less than the refractive index of the transparent conductive oxide film layer, i.e. the anode, thus, the total reflection caused by the large refractive index difference between the transparent conductive oxide film layer 3, i.e. the anode, and the base substrate 1 is reduced, thus the loss of light transmitted in the OLED (the direction indicated by the arrows in FIG. 3a and FIG. 3b is the light propagation direction) is reduced, and hence the display brightness of the OLED can be increased.

In one example, the OLED further comprises a hole injection layer, a hole transport layer, a light emitting layer, an electron transport layer and an electron injection layer disposed between the anode and the cathode 10, and will not be further described herein. The OLED may emit, for example, full fluorescence, full phosphorescence, or combined fluorescence-phosphorescence, there is not limitation thereon.

Based on the same inventive concept, the embodiment of the present invention further provides a display device comprising the above display panel provided by the embodiments of the present invention, the display device may be any product or component having display function, such as a mobile phone, a tablet computer, a television, a display, a laptop computer, a digital photo frame, a navigator, and so on, and the display device can be specifically implemented by referring to the above embodiments in relation to the display panel, and will not be further described.

The embodiments of the present invention provide a display substrate, a display panel, and a display device. Since at least one color of the color filter units in the color film structure of the display substrate comprises at least two layers of laminated color filter films, and in the color filter unit comprising the at least two layers of laminated color filter films, the refractive index of the color filter films is gradually increased in a direction from the base substrate towards the transparent conductive oxide film layer, the layer of the color filter film adjacent to the base substrate has refractive index larger than that of the base substrate, and the layer of the color filter film adjacent to the transparent conductive oxide film layer has refractive index less than that of the transparent conductive oxide film layer, in this way, when the light is incident onto the transparent conductive oxide film layer and exits the base substrate after passing through the color film structure, the total reflection caused by the large refractive index difference between the transparent conductive oxide film layer and the base substrate can be reduced, and thus the loss of light transmitted in the display panel can be reduced, and hence the display brightness of the display device can be increased.

What is described above is related to the illustrative embodiments of the disclosure only and not limitative to the scope of the disclosure; the scopes of the disclosure are defined by the accompanying claims.

The present application claims the priority of Chinese Patent Application No. 201410262118.1 filed on Jun. 12, 2014, the disclosure of which is incorporated herein by reference in its entirety.

The invention claimed is:

1. A display substrate, comprising: a base substrate, and a color film structure and a transparent conductive oxide film layer subsequently laminated on the base substrate, wherein the color film structure comprises a plurality of color filter units arranged in a matrix and having different color;

wherein at least one color of the color filter units in the color film structure comprises at least two layers of laminated color filter films, refractive indices of the color filter films gradually increases in a direction from the base substrate towards the transparent conductive oxide film layer, and one layer of the color filter films adjacent to the base substrate has a refractive index larger than that of the base substrate, one layer of the color filter films adjacent to the transparent conductive oxide film layer has a refractive index less than that of the transparent conductive oxide film layer.

2. The display substrate according to claim 1, wherein a thickness of each layer of the color filter film is less than or equal to 0.45 µm.

3. The display substrate according to claim 2, wherein the thickness of each layer of the color filter film is less than a minimum wavelength of visible light.

4. The display substrate according to claim 1, wherein the color film structure comprises a blue color filter unit, and the blue color filter unit comprises at least two layers of laminated color filter films.

5. The display substrate according to claim 4, wherein the blue color filter unit comprises four layers of laminated color filter films.

6. The display substrate according to claim 1, wherein the color filter units in all colors in the color film structure each comprises at least two layers of laminated color filter films.

7. The display substrate according to claim 6, wherein the color filter units in all colors in the color film structure each comprises four layers of laminated color filter films.

8. The display substrate according to claim 4, wherein the color film structure further comprises a red color filter unit and a green color filter unit, the red color filter unit and the green color filter unit are of single-layer structure.

9. The display substrate according to claim 1, further comprising a flat layer disposed between the color film structure and the transparent conductive oxide film layer.

10. The display substrate according to claim 9, further comprising a black matrix disposed between adjacent color filter units.

11. A display panel, comprising the display substrate according to claim 1.

12. The display panel according to claim 11, wherein the display panel is a liquid crystal display panel or an organic light emitting diode display panel.

13. The display panel according to claim 11, wherein the display panel is the liquid crystal display panel and comprises the display substrate functioning as a color film substrate, an array substrate, and a liquid crystal layer sandwiched between the color film substrate and the array substrate.

14. The display penal according to claim 11, wherein the display panel is the organic light emitting diode display panel, wherein the transparent conductive oxide film layer functions as an anode, the organic light emitting diode display panel further comprises a light emitting layer, a cathode, a pixel defining layer, and an encapsulation layer.

15. A display device, comprising the display panel according to claim 1.

16. The display substrate according to claim 5, wherein the color film structure further comprises a red color filter unit and a green color filter unit, the red color filter unit and the green color filter unit are of single-layer structure.

* * * * *